US012784788B2

(12) United States Patent
Jung et al.

(10) Patent No.: US 12,784,788 B2
(45) Date of Patent: Nov. 3, 2026

(54) COMPUTE-IN-MEMORY DEVICE AND PASSIVE VOLTAGE AMPLIFIER CIRCUIT FOR DIFFERENTIAL SAR ADC OF CIM DEVICE

(71) Applicant: UIF (University Industry Foundation), Yonsei University, Seoul (KR)

(72) Inventors: Seong Ook Jung, Seoul (KR); Do Han Kim, Seoul (KR); Min Young Jo, Seoul (KR)

(73) Assignee: UIF (UNIVERSITY INDUSTRY FOUNDATION), YONSEI UNIVESITY, Seoul (KR)

( * ) Notice: Subject to any disclaimer, the term of this patent is extended or adjusted under 35 U.S.C. 154(b) by 139 days.

(21) Appl. No.: 19/005,679

(22) Filed: Dec. 30, 2024

(65) Prior Publication Data

US 2025/0232797 A1 Jul. 17, 2025

(30) Foreign Application Priority Data

Jan. 15, 2024 (KR) ........................ 10-2024-0006255

(51) Int. Cl.
*G11C 7/06* (2006.01)
*G06F 7/544* (2006.01)
*G11C 7/16* (2006.01)

(52) U.S. Cl.
CPC .............. *G11C 7/16* (2013.01); *G06F 7/5443* (2013.01)

(58) Field of Classification Search
CPC ....... G11C 7/16; G11C 7/1006; G11C 11/419; G11C 11/54; G06F 7/5443
USPC .................................................... 365/189.07
See application file for complete search history.

(56) References Cited

U.S. PATENT DOCUMENTS

| | | | | |
|---|---|---|---|---|
| 7,265,708 B2 * | 9/2007 | Mitra | H03M 1/004 341/172 |
| 9,319,059 B1 * | 4/2016 | Sharma | H03M 1/403 |
| 9,538,928 B2 * | 1/2017 | Lo | A61B 5/31 |
| 2021/0271597 A1 * | 9/2021 | Verma | G06F 12/0207 |

OTHER PUBLICATIONS

Biswas et al., "CONV-SRAM: An Energy-Efficient SRAM With In-Memory Dot-Product Computation for Low-Power Convolutional Neural Networks", IEEE Journal of Solid-State Circuits, vol. 54, No. 1, pp. 217-230, Jan. 2019 (14 pages).

* cited by examiner

*Primary Examiner* — Tha-Oh Bui
(74) *Attorney, Agent, or Firm* — MICHAEL BEST & FRIEDRICH LLP

(57) ABSTRACT

A Compute-In-Memory (CIM) device according to the present disclosure includes first to fourth global bit lines (GBLs) each configured to be divided into two sub-global bit lines having the same capacitance; first to fourth switches each configured to be connected between the sub-global bit lines of each of the first to fourth global bit lines; and a switching circuit configured to generate a differential input voltage for a differential Successive Approximation Register (SAR) Analog-to-Digital Converter (ADC) by reflecting a corresponding bit position from an output voltage of each of the first to fourth global bit lines, the differential SAR ADC being configured to receive the differential input voltage to generate a digital signal.

14 Claims, 14 Drawing Sheets

COMPUTE-IN-MEMORY DEVICE AND PASSIVE VOLTAGE AMPLIFIER CIRCUIT FOR DIFFERENTIAL SAR ADC OF CIM DEVICE

TECHNICAL FIELD

The present disclosure relates to a Compute-In-Memory (CIM) device and a passive voltage amplifier circuit for a differential Successive Approximation Register (SAR) Analog-to-Digital Converter (ADC) thereof.

BACKGROUND ART OF THE INVENTION

In the case of the conventional Von Neumann structure, a processor and memory are separated, and the processor leads data stored in the memory to perform an operation, so there is a limit to improve energy efficiency and operation speed according to data access and transmission. In addition, recently, due to the development of artificial neural network technology, Multiply-Accumulation (MAC) operation between input data and weights in Deep Neural Network (DNN) has to be performed on a large scale, and thus there is a need for a technique to improve the energy efficiency and operation speed.

A Compute-In-Memory (CIM) or In-Memory Compute (IMC) structure has been proposed to maximize efficiency by performing the operation using the memory that stores the data. In such a CIM structure, the memory storing the data directly performs the operation without transmitting data to the processor, so it is possible to perform the operation at low power and high speed by overcoming the limit of the conventional Von Neumann structure.

The analog CIM structure performs the Multiply-Accumulation (MAC) operation in the analog domain (current, voltage, time) and quantizes the final calculated result using an Analog-to-Digital Converter (ADC). Generally, the ADC consumes a lot of power and occupies a large area, which reduces TOPS/W. In addition, the analog CIM structure must have an output ratio suitable to ensure accuracy. The output ratio is expressed as "Input precision×(accumulation number)/ADC precision". In general, even with the same output ratio, a structure with a larger accumulation number is highly accurate. However, there is a large overhead of power and area in high-bit ADC that quantize more operations. Therefore, reducing the accumulation number and precision of the ADC can help reduce the power and area of the entire ADC, thereby securing TOPS/W.

FIGS. 1 to 3 show a general operation of a Compute-In-Memory (CIM).

FIG. 1 is an input charging stage, in which each cell stores a weight and charges a read bit line (RBL) to VDD or 0 depending on input data.

FIG. 2 is a multiplication stage, in which a read word line (RWL) is turned on to maintain the voltage of the read bit line (RBL) or discharge it to zero depending on the weight.

FIG. 3 is an accumulation step, and a switch between each read bit line (RBL) and a global bit line (GBL) is turned on to add a value multiplied by the lead bit line (RBL). Due to charge sharing, the voltage of the global bit line (GBL) becomes $$V_{GBL} = \frac{V_0 + V_1 + \dots V_{31}}{32},$$

and the MAC operation result is output.

FIGS. 4 and 5 show a structure and operation of an Analog-to-Digital Converter (ADC) of a general CIM.

The ADC converts an analog voltage output through the global bit line (GBL) into a digital value. Since a sense amplifier (SA) for conversion should have a small offset, it must have a large operating power and a large area.

In the operation of the ADC, the reference voltage Vref switches as many times as the number of bits of the ADC, and the sense amplifier (SA) operates as many times as the number of bits of the ADC. Therefore, as the number of bits of the ADC increases, the power overhead increases, so it is required to reduce the number of the ADC and the number of operations.

FIG. 6 shows an example of a structure of a conventional CIM ADC (a. Biswas and A. P. Chandrakasan, "CONV-SRAM: An Energy-Efficient SRAM With In-Memory Dot-Product Computation for Low-Power Convolutional Neural Networks", in IEEE Journal of Solid-State Circuits, vol. 54, no. 1, pp. 217-230, January 2019).

The structure of FIG. 1 is a structure in which an ADC is provided for each global bit line (GBL) corresponding to each bit position, and thus a large number of ADCs are required and a digital shift and an adder are required. The structure of FIG. 2 is a problem in that ADC is included into each global bit line (GBL), so the overhead of energy and area is large, and additional area and power are consumed due to digital logic such as a digital shift and adder and a complement converter of 2's.

PRIOR ART DOCUMENT

Non-Patent Document (Non-patent document 1) A. Biswas and A. P. Chandrakasan, "CONV-SRAM: An Energy-Efficient SRAM With In-Memory Dot-Product Computation for Low-Power Convolutional Neural Networks," in IEEE Journal of Solid-State Circuits, vol. 54, no. 1, pp. 217-230, January 2019

CONTENTS OF INVENTION

Technical Problem

Embodiments of the present disclosure propose a CIM device capable of reducing the number of ADCs required per global bit line (GBL) and reducing the precision of the ADCs, and a passive voltage amplifier circuit for a differential SAR ADC of the CIM device.

In the case of conventional structures, additional digital shifters and adders are required for bit positioning, which limits area and energy efficiency. In an embodiment of the present disclosure, a CIM device capable of securing area and energy efficiency by implementing bit positioning in an analog domain using charge sharing and switching control is proposed.

In the case of the conventional ADC, the area and energy efficiency are limited by requiring high ADC precision to ensure target accuracy. In an embodiment of the present disclosure, a passive voltage amplifier capable of securing the area and energy efficiency compared to the conventional structure by reducing ADC precision while securing target accuracy through an effect of more closely quantizing even with the same ADC precision is proposed.

Embodiments of the present disclosure propose a CIM device capable of implementing a low-area and low-power CIM structure through a smaller number of ADCs and a smaller ADC precision compared to the conventional CIM structure, and a passive voltage amplifier circuit for a differential SAR ADC of the CIM device.

The technical problem to be solved is not limited to the above-mentioned technical problems, and other technical problems not mentioned may be clearly understood by those skilled in the art from the following description.

Technical Solution

A Compute-In-Memory (CIM) device according to the present disclosure to solve the technical problem includes first to fourth global bit lines (GBLs) each configured to be divided into two sub-global bit lines having the same capacitance; first to fourth switches each configured to be connected between the sub-global bit lines of each of the first to fourth global bit lines; and a switching circuit configured to generate a differential input voltage for a differential Successive Approximation Register (SAR) Analog-to-Digital Converter (ADC) by reflecting a corresponding bit position from an output voltage of each of the first to fourth global bit lines, the differential SAR ADC being configured to receive the differential input voltage to generate a digital signal.

The first to third global bit lines may be GBLs corresponding to remaining bits except for a most significant bit, and the fourth global bit line may be a GBL corresponding to the most significant bit.

The switching circuit may generate the first voltage of the differential input voltage by reflecting the bit position from the output voltage of each of the first to third global bit lines, and generate the second voltage of the differential input voltage by reflecting the bit position from the output voltage of the fourth global bit line.

The switching circuit may include a fifth switch configured to have one end connected to the first global bit line; a sixth switch configured to have one end connected to the second global bit line; a seventh switch configured to have one end connected to the third global bit line; an eighth switch configured to have one end connected to the fourth global bit line;

a ninth switch configured to be connected between the other end of the fifth switch and the other end of the sixth switch; a tenth switch configured to be connected between the other end of the sixth switch and the other end of the seventh switch; an eleventh switch configured to be connected between the other end of the sixth switch and a VDD; and a twelfth switch configured to be connected between the other end of the eighth switch and a VDD.

The first to fourth switches may be connected, the fifth to eighth switches may be blocked, and the ninth to twelfth switches may be blocked in operations of a Digital-to-Analog Convert (DAC) and a Multiply-Accumulate (MAC), the third switch may be blocked, and the seventh switch may be connected in order to reflect the bit position, then the third switch may be connected, and the seventh switch may be blocked, then the second switch may be blocked, the third switch may be blocked, the fifth to eighth switches may be connected, and the eleventh and twelfth switches may be blocked.

The differential input voltage may be composed of a first voltage and a second voltage, and the differential SAR ADC may include a passive voltage amplifier circuit configured to output the differential voltage amplified by a difference between the first voltage and the second voltage to a comparator.

The passive voltage amplifier circuit may include a first input terminal where the first voltage is input; a second input terminal where the second voltage is input; a first output terminal; a second output terminal; a first 2:1 MUX; a second 2:1 MUX; a first capacitor configured to be connected between an output of the first 2:1 MUX and the first output terminal; a second capacitor configured to be connected between an output of the second 2:1 MUX and the second output terminal; a first switch configured to be connected between the first input terminal and the first output terminal; and a second switch configured to be connected between the second input terminal and the second output terminal, wherein the first input terminal is connected to a "1" input of the first 2:1 MUX and a "0" input of the second 2:1 MUX, and the second input terminal is connected to a "0" input of the first 2:1 MUX and a "1" input of the second 2:1 MUX.

The control input of the first 2:1 MUX and the control input of the second 2:1 MUX are configured so that the same control signal is applied.

The first voltage may be a voltage corresponding to a MAC operation result of remaining bits except for a most significant bit, and the second voltage may be a voltage corresponding to a MAC operation result of the most significant bit.

The first output terminal may be connected to a (+) input of a comparator, and the second output terminal may be connected to a (−) input of the comparator.

The first switch and the second switch are connected and the "0" is each applied to the control input of the first 2:1 MUX and the control input of the second 2:1 MUX, such that the second voltage may be output as the output of the first 2:1 MUX, the first voltage may be output as the output of the second 2:1 MUX, the first voltage may be output as the first output terminal, and the second voltage may be output as the second output terminal, and then the first switch and the second switch may be blocked, and the "1" is each applied to the control input of the first 2:1 MUX and the control input of the second 2:1 MUX, such that the first voltage may be output as the output of the first 2:1 MUX, and the second voltage may be output as the output of the second 2:1 MUX, and the differential voltage amplified by a difference between the first voltage and the second voltage may be output through the first output terminal and the second output terminal by coupling each of the first capacitor and the second capacitor.

A passive voltage amplifier circuit for a differential SAR ADC of a CIM device according to the present disclosure to solve the technical problem may include a first input terminal where a first voltage of a differential input voltage is input; a second input terminal where a second voltage of the differential input voltage is input; a first output terminal; a second output terminal; a first 2:1 MUX; a second 2:1 MUX; a first capacitor configured to be connected between an output of the first 2:1 MUX and the first output terminal; a second capacitor configured to be connected between an output of the second 2:1 MUX and the second output terminal; a first switch configured to be connected between the first input terminal and the first output terminal; and a second switch configured to be connected between the second input terminal and the second output terminal, wherein the first input terminal is connected to a "1" input of the first 2:1 MUX and a "0" input of the second 2:1 MUX, and the second input terminal is connected to a "0" input of the first 2:1 MUX and a "1" input of the second 2:1 MUX The control input of the first 2:1 MUX and the control input of the second 2:1 MUX are configured so that the same control signal is applied.

The first voltage may be a voltage corresponding to a MAC operation result of remaining bits except for a most significant bit, and the second voltage may be a voltage corresponding to a MAC operation result of the most significant bit.

The first output terminal may be connected to a (+) input of a comparator, and the second output terminal may be connected to a (−) input of the comparator.

The first switch and the second switch are connected and the "0" is each applied to the control input of the first 2:1 MUX and the control input of the second 2:1 MUX, such that the second voltage may be output as the output of the first 2:1 MUX, the first voltage may be output as the output of the second 2:1 MUX, the first voltage may be output as the first output terminal, and the second voltage may be output as the second output terminal, and then the first switch and the second switch may be blocked, and the "1" is each applied to the control input of the first 2:1 MUX and the control input of the second 2:1 MUX, such that the first voltage may be output as the output of the first 2:1 MUX, and the second voltage may be output as the output of the second 2:1 MUX, and the differential voltage amplified by a difference between the first voltage and the second voltage may be output through the first output terminal and the second output terminal by coupling each of the first capacitor and the second capacitor.

Effects of the Invention

According to embodiments of the present disclosure, the number of ADCs required per global bit line (GBL) may be reduced, and the precision of the ADCs may be reduced.

In the embodiment of the present disclosure, the bit positioning can be implemented in the analog domain using charge sharing and switching control thereby securing the area and energy efficiency.

In the embodiment of the present disclosure, the area and energy efficiency may be secured compared to the conventional structure by reducing ADC precision while securing target accuracy through an effect of more closely quantizing even with the same ADC precision.

The embodiments of the present disclosure may implement the low-area and low-power CIM structure through a smaller number of ADCs and a smaller ADC precision compared to the conventional CIM structure.

The effects of the present disclosure are not limited to the above-mentioned effects, and other effects not mentioned can be clearly understood by those skilled in the art from the following description.

DETAILED DESCRIPTION FOR IMPLEMENT THE INVENTION

Figure 1:
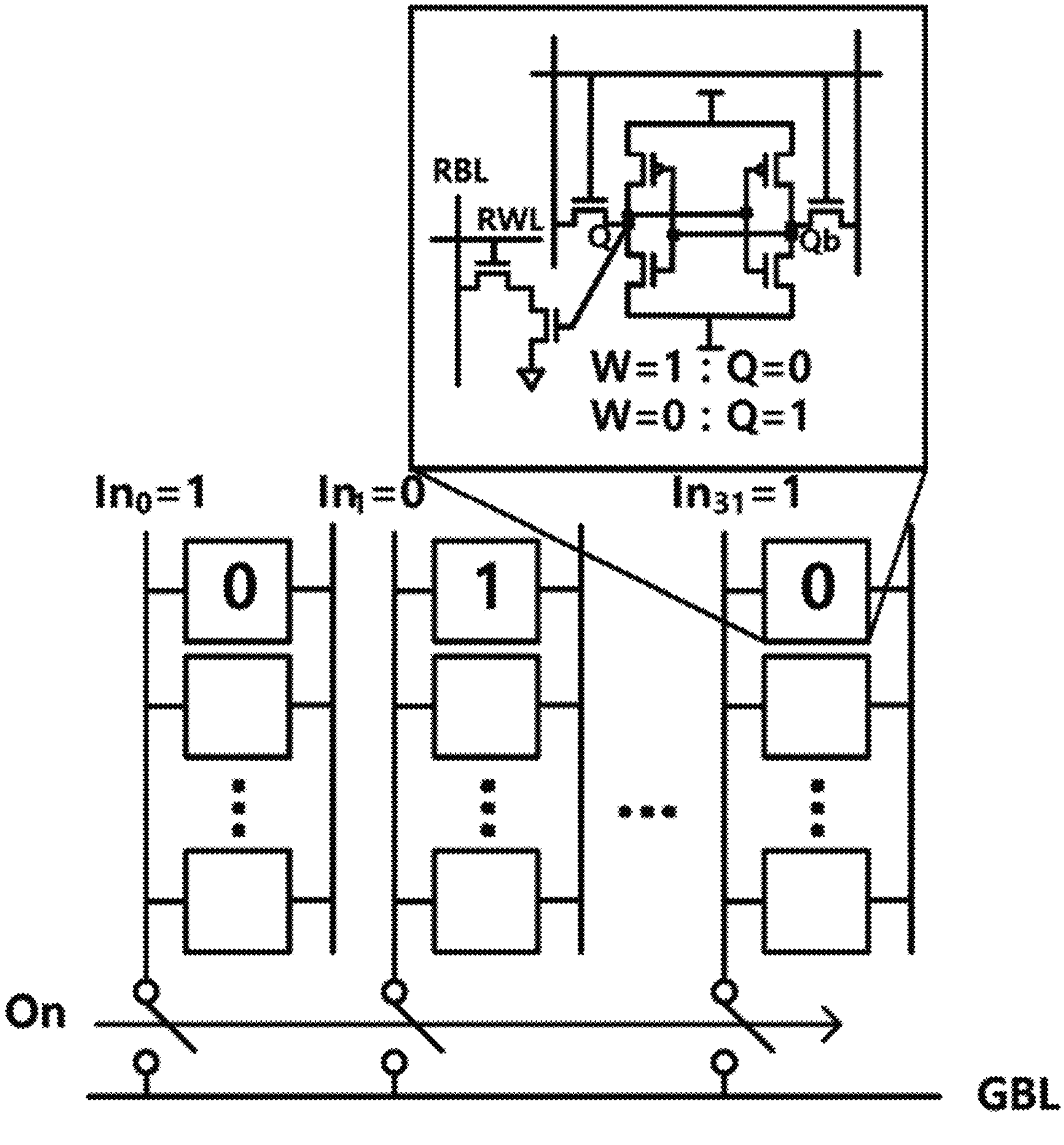
FIGS. 1 to 3 show a general operation of a Compute-In-Memory (CIM).
Figure 2:
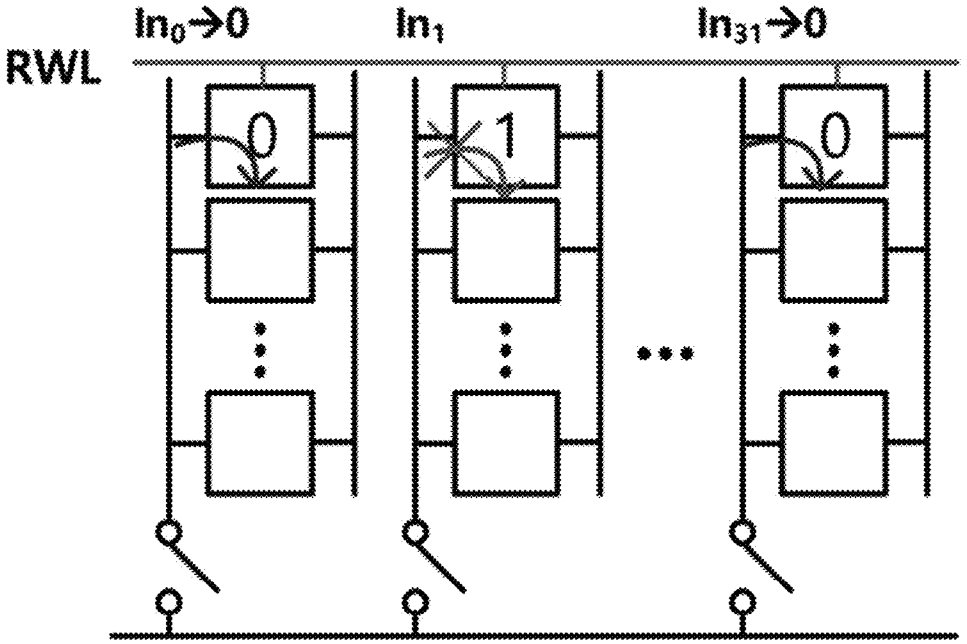
Figure 3:
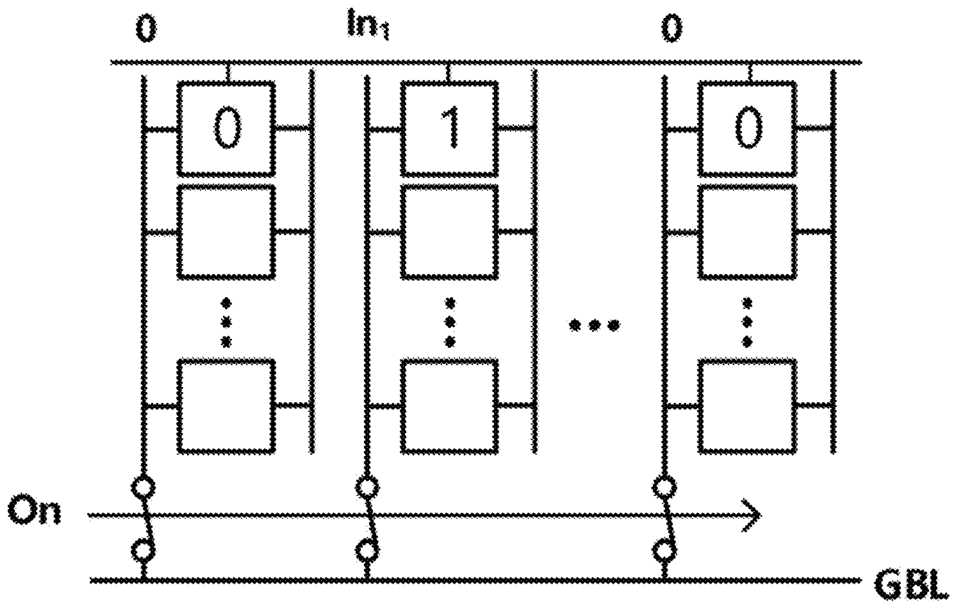
Figure 4:
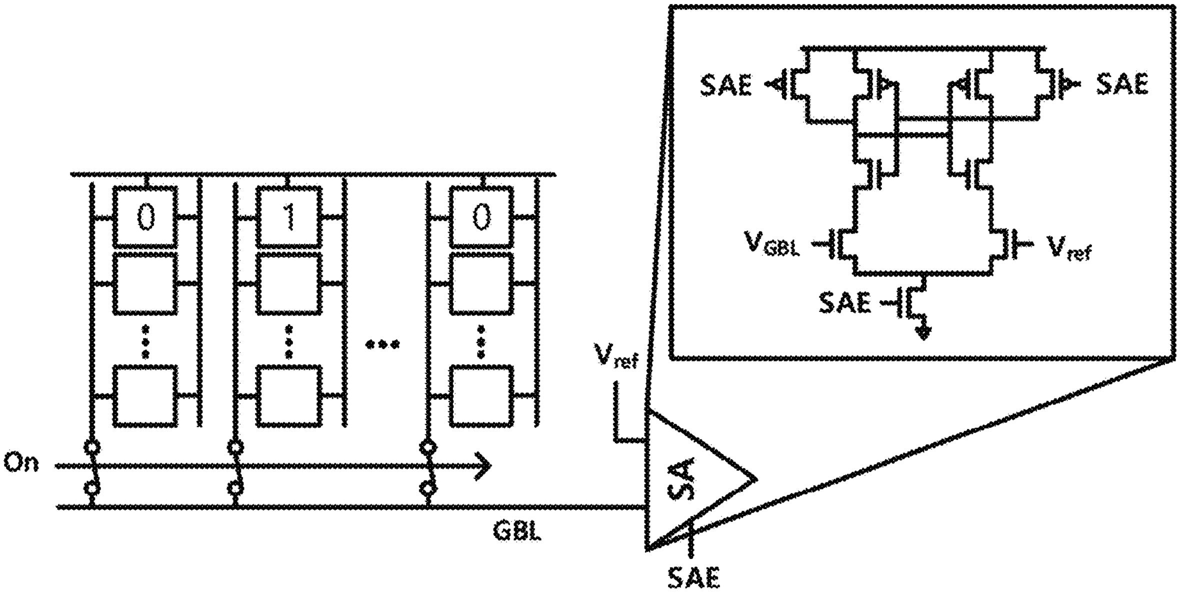
FIGS. 4 and 5 show a structure and operation of an Analog-to-Digital Converter (ADC) of a general CIM.
Figure 5:
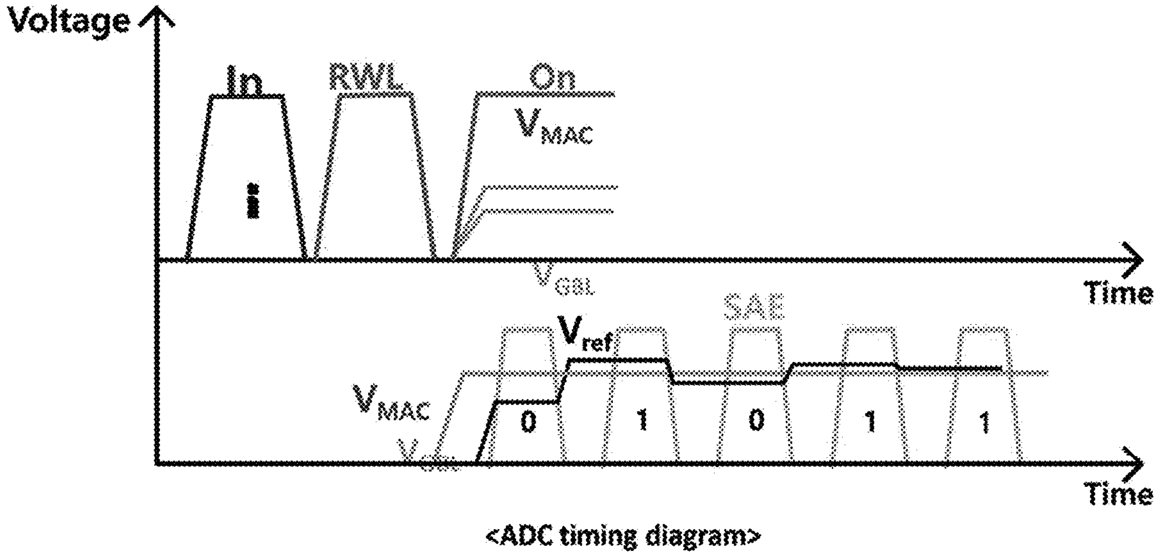
Figure 6:
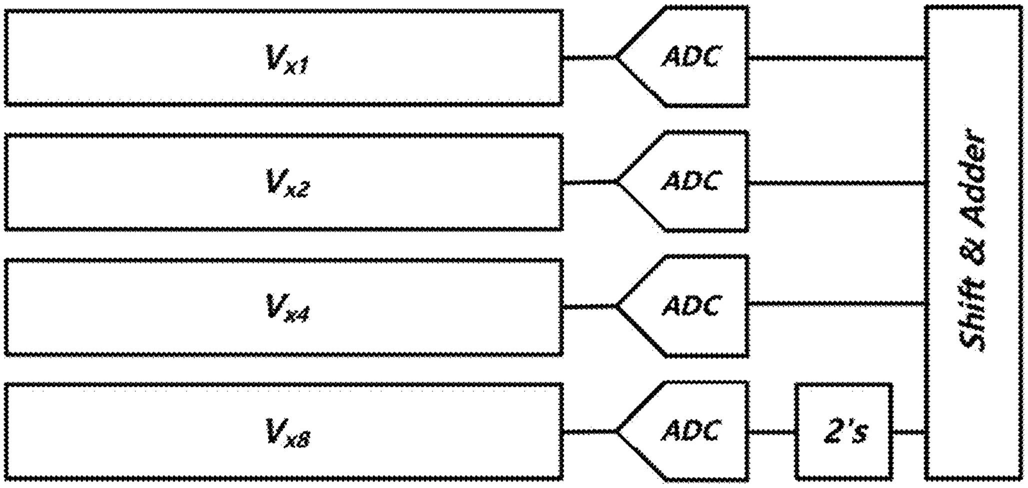
FIG. 6 shows an example of a structure of a conventional CIM ADC.

Hereinafter, preferred embodiments of the present disclosure will be described in detail with reference to the drawings. In the following description and the accompanying drawings, substantially the same components are represented by the same reference numerals, and a duplicate description will be omitted. In addition, in describing the present disclosure, if it is judged that the detailed description of the related known function or configuration may unnecessarily obscure the gist of the present disclosure, the detailed description thereof will be omitted.

Figure 7:
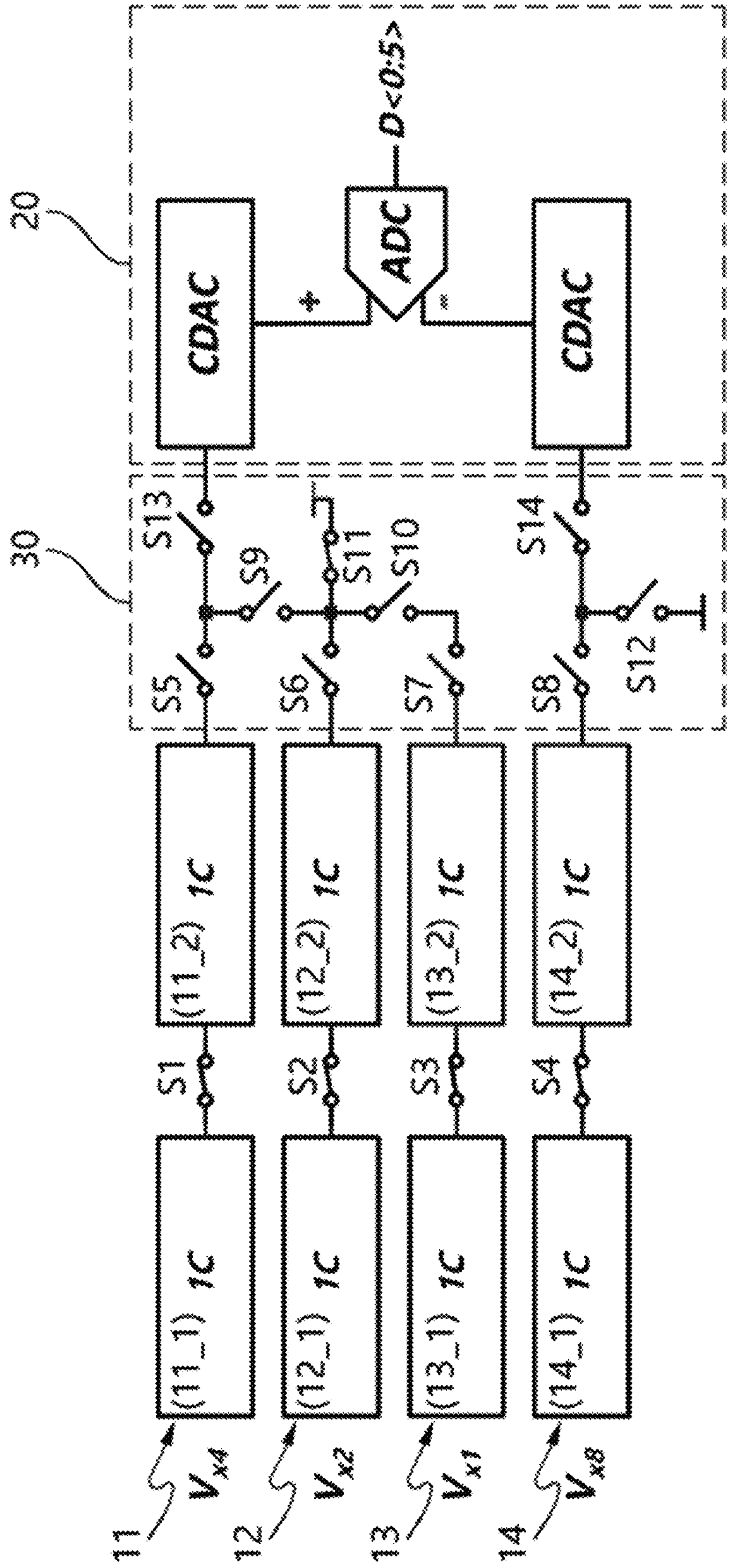
FIG. 7 shows a structure of a SIM device according to an embodiment of the present disclosure.

FIG. 7 shows a structure of a SIM device according to an embodiment of the present disclosure.

The SIM device according to the embodiment of the present disclosure includes first to fourth global bit lines (GBLs) 11, 12, 13, and 14. For convenience, a cell array connected to each global bit line (GBL) is omitted. Each global bit line (GBL) corresponds to a bit position. For example, the first global bit line 11 corresponds to a x4 bit position, the second global bit line 12 corresponds to a x2 bit position, the third global bit line 13 corresponds to a x1 bit position, and the fourth global bit line 14 corresponds to a x8 bit position. That is, the fourth global bit line 14 corresponds to the most significant bit, and the first to third global bit lines 11, 12, 13 correspond to the remaining bits except the most significant bit.

The first to fourth global bit lines 11, 12, 13, and 14 are each divided into two sub-global bit lines having the same capacitance. That is, the number of cell columns connected to each sub-global bit line of one global bit line is the same. The first global bit line 11 is divided into two sub-global bit lines 11_1 and 11_2. The second global bit line 12 is divided into two sub-global bit lines 12_1 and 12_2. The third global bit line 13 is divided into two sub-global bit lines 13_1 and 13_2. The fourth global bit line 14 is divided into two sub-global bit lines 14_1 and 14_2.

In each global bit line, the switch is connected between the sub-global bit lines That is, the first switch S1 is connected between the sub-global bit lines 11_1 and 11_2, the second switch S2 is connected between the sub-global bit lines 12_1 and 12_2, the third switch S3 is connected between the sub-global bit lines 13_1 and 13_2, and the fourth switch S4 is connected between the sub-global bit lines 14_1 and 14_2.

A switching circuit 30 is provided between the first to fourth global bit lines 11, 12, 13, and 14 and a differential Successive Approximation Register (SAR) Analog-to-Digital Converter (ADC) 20. The switching circuit 30 reflects the corresponding bit position from an output voltage of each of the first to fourth global bit lines 11, 12, 13, and 14 to generate a differential input voltage for the differential SAR ADC 20. The differential SAR ADC 20 receives the differential input voltage from the switching circuit 30 to generate a digital signal. Specifically, the switching circuit 30 generates the first voltage of the differential input voltage by reflecting the bit position from the output voltage of each of the first to third global bit lines 11, 12, and 13, and generates the second voltage of the differential input voltage by reflecting the bit position from the output voltage of the fourth global bit line 14. The first voltage is input to the (+) terminal of the differential SAR ADC 20, and the second voltage is input to the (–) terminal of the differential SAR ADC 20.

The switching circuit may include the fifth to fourteenth switches S5 to S14. The fifth switch S5 has one end connected to the first global bit line 11, the sixth switch S6 has one end connected to the second global bit line 12, the seventh switch S7 has one end connected to the third global bit line 13, and the eighth switch S8 has one end connected to the fourth global bit line 14. The ninth switch S9 is connected between the other end of the fifth switch S5 and the other end of the sixth switch S6. The tenth switch S10 is connected between the other end of the sixth switch S6 and the other end of the seventh switch S7. The eleventh switch S11 is connected between the other end of the sixth switch S6 and VDD. The twelfth switch S12 is connected between the other end of the eighth switch S8 and VDD. The thirteenth switch 13 is connected between the other end of the fifth switch S5 and the (+) terminal of the differential SAR ADC 20. The fourteenth switch S14 is connected between the other end of the eighth switch S8 and the (–) terminal of the differential SAR ADC 20.

FIGS. 8 to 11 show an operation of the SIM device according to an embodiment of the present disclosure.

Figure 8:
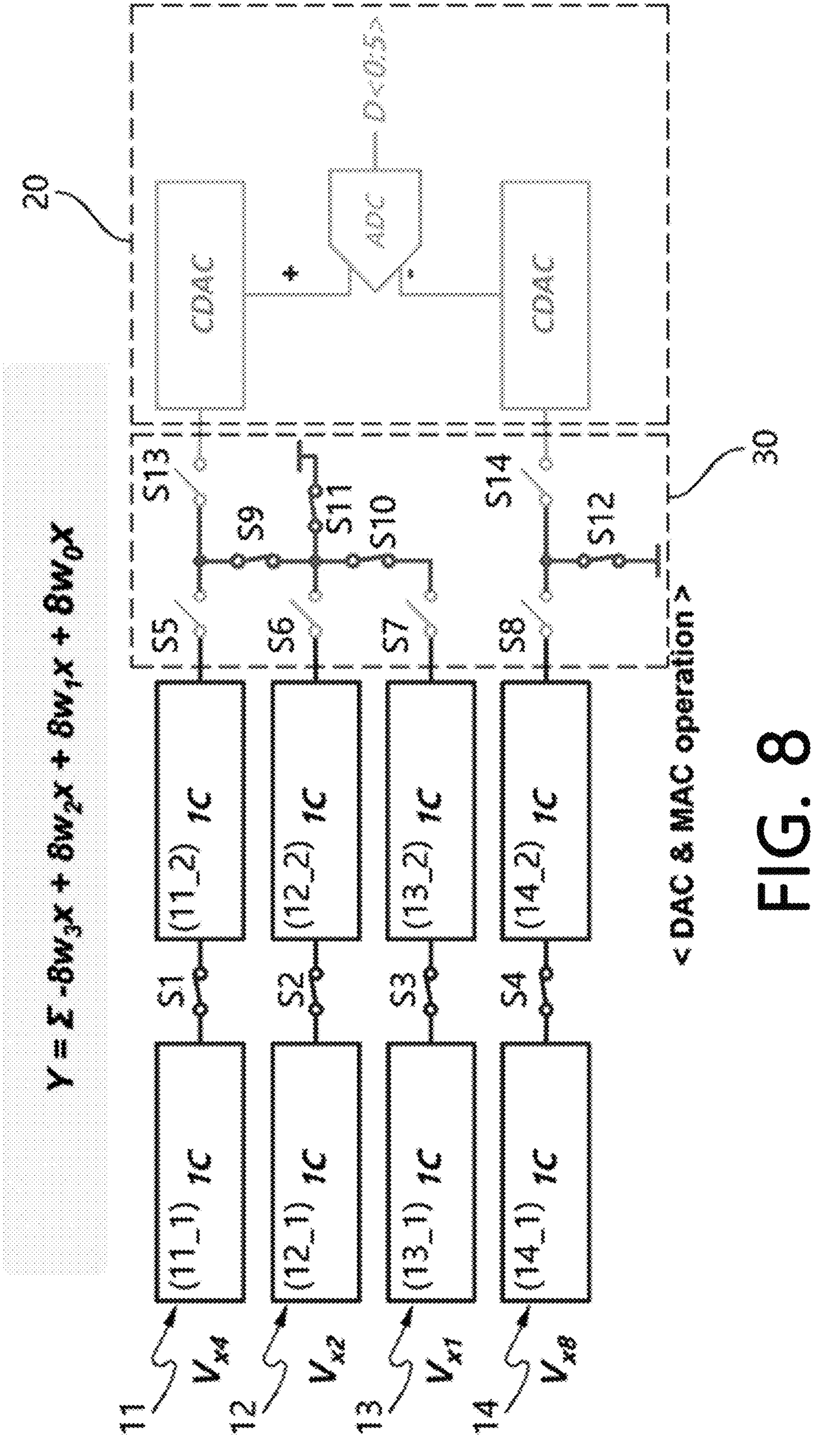
FIGS. 8 to 11 show an operation of the SIM device according to an embodiment of the present disclosure.

Referring to FIG. 8, in the Digital-to-Analog Convert (DAC) and Multiply-Accumulate (MAC) operations, first to fourth switches S1, S2, S3, and S4 are connected, fifth to eighth switches S5, S6, S7, and S8 are blocked, and ninth to twelfth switches S9, S10, S11, and S12 are blocked. Therefore, the results of MAC operation without bit positions reflected are stored in the first to fourth global bit lines 11, 12, 13, and 14, respectively.

Figure 9:
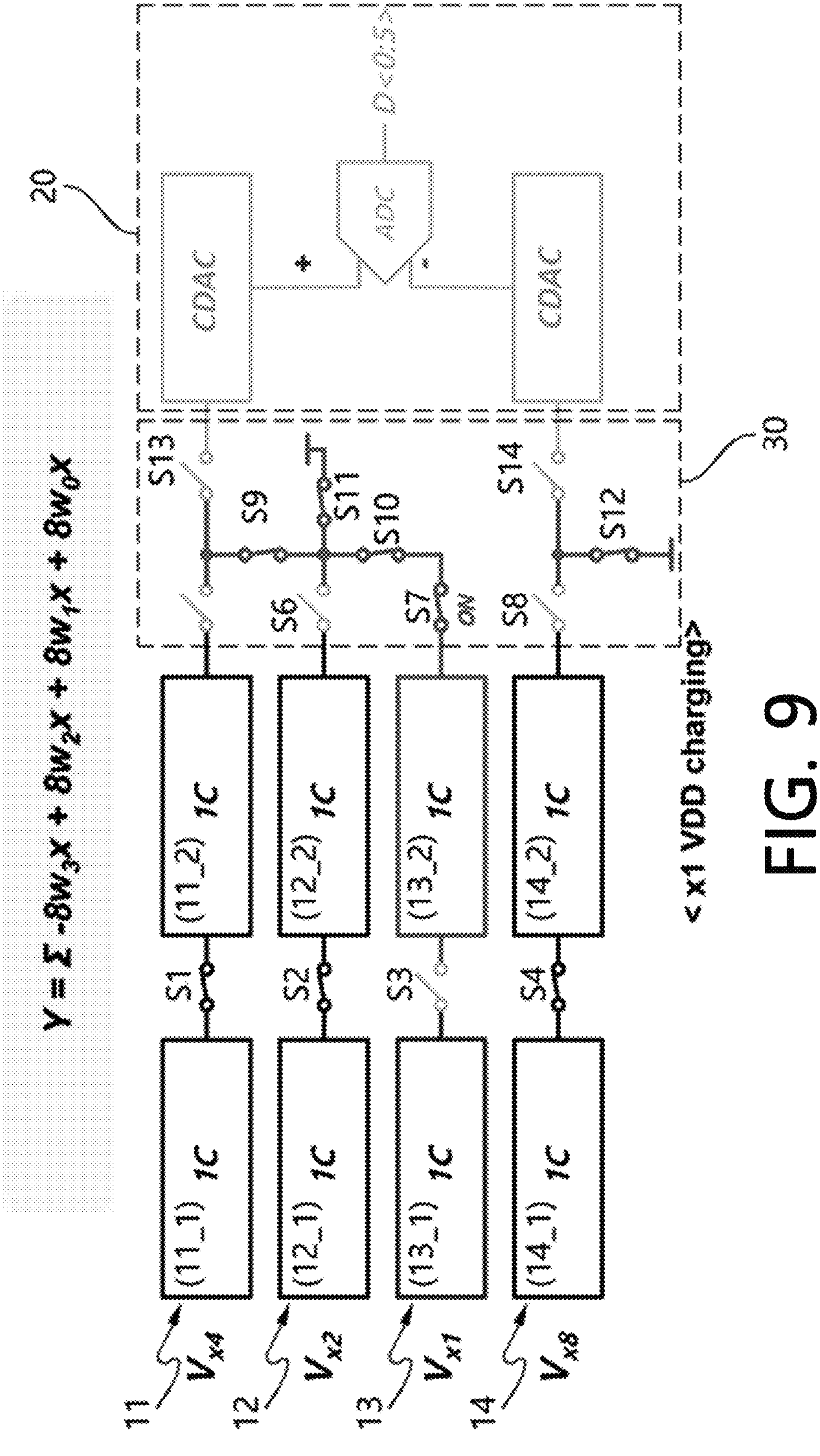
Figure 10:
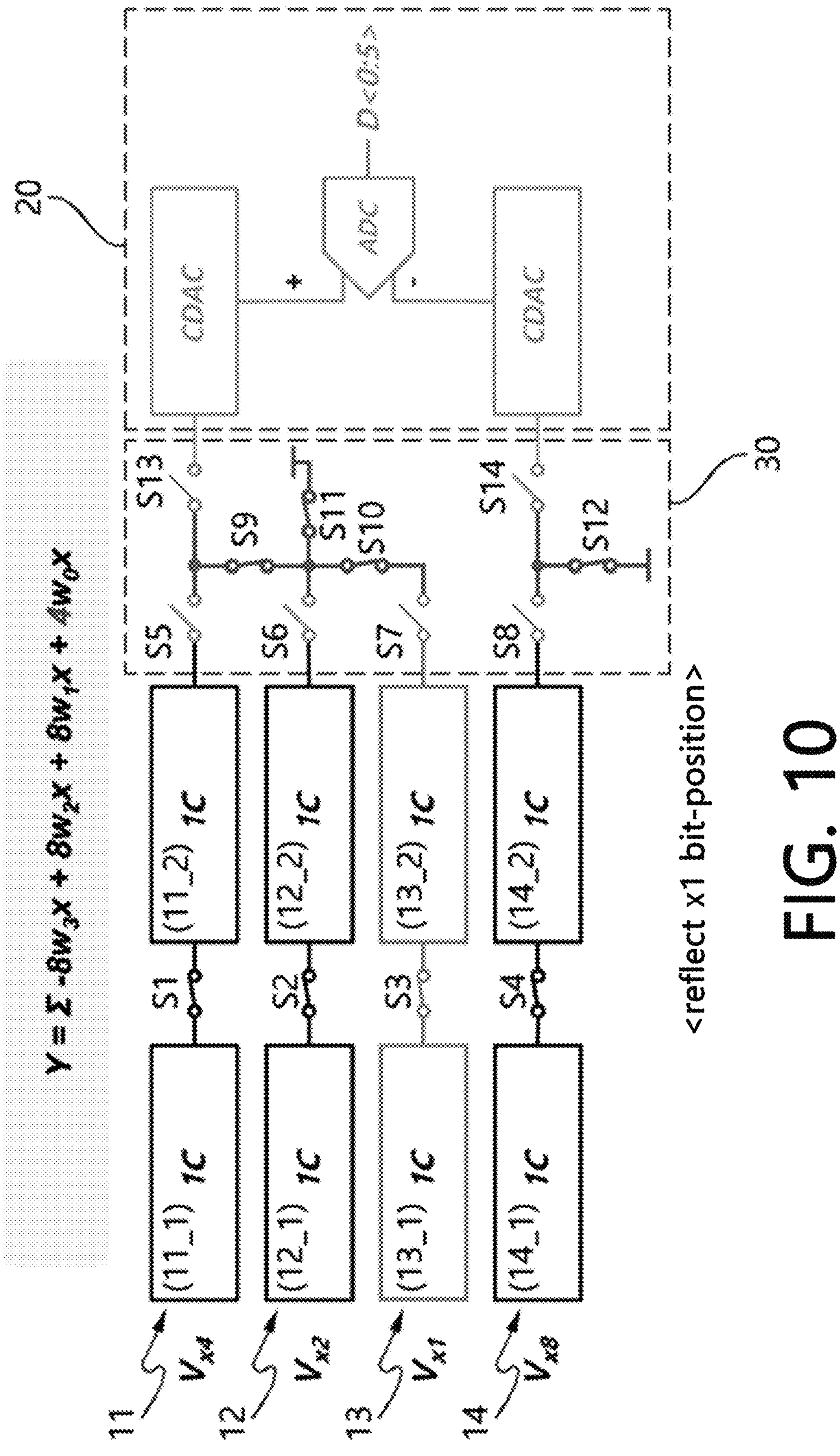
Figure 11:
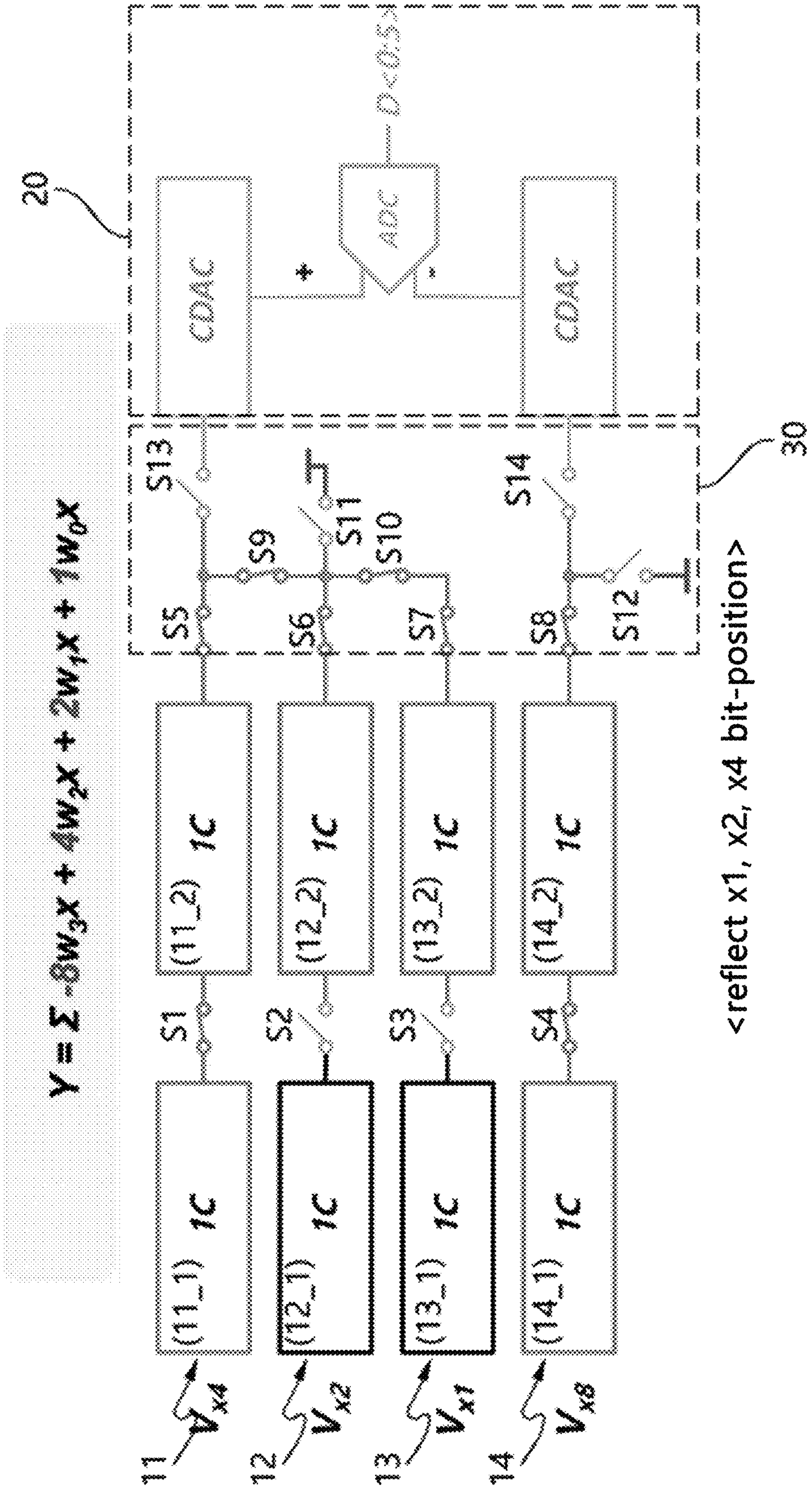

FIGS. 9 to 11 show operations for outputting the results of the MAC operation reflecting bit positions.

Referring to FIG. 9, the third switch S3 is blocked and the seventh switch S7 is connected. Through this, the first sub-global bit line 13_1 of the third global bit line 13 still stores a corresponding MAC operation result, and the second sub-global bit line 13_2 is charged to VDD.

Next, referring to FIG. 10, the third switch S3 is connected and the seventh switch S7 is blocked. Through this, charge sharing occurs between the first sub-global bit line 13_1 and the second sub-global bit line 13_2 of the third global bit line 13, and the result of the MAC operation stored in the third global bit line 13 is multiplied by ½.

Next, referring to FIG. 11, the second switch S2 is blocked, the third switch S3 is blocked, the fifth to eighth switches S5, S6, S7, and S8 are connected, and the eleventh and twelfth switches S11 and S12 are blocked. Through this, charge sharing occurs between the first and second sub-global bit lines 11_1 and 11_2 of the first global bit line 11, the second sub-global bit line 12_2 of the second global bit line 12, and the second sub-global bit line 13_2 of the third global bit line 13. Therefore, the MAC operation result stored in the first global bit line 11 is multiplied by 2/4, that is, ½, the MAC operation result stored in the second global bit line 12 is multiplied by ¼, and the MAC operation result previously multiplied by ½ stored in the third global bit line 13 is multiplied by ¼, so that the MAC operation result is multiplied by ⅛. Therefore, the result of the MAC operation reflecting the bit positions in the first to fourth global bit lines 11, 12, 13, and 14 is obtained.

Then, although not shown, when the thirteenth switch S13 and the fourteenth switch S14 are connected, the first voltage corresponding to the MAC operation result of the first to third global bit lines 11, 12, and 13 is applied to the (+) terminal of the differential SAR ADC 20, and the second voltage corresponding to the MAC operation result of the fourth global bit line 14 is applied to the (–) terminal of the differential SAR ADC 20.

According to the embodiment of the present disclosure, the result of the MAC operation may be obtained by reflecting the bit position of the weight without an additional capacitor, so that the circuit area may be reduced. In addition, compared to the conventional technology that requires an ADC for each row (global bit line), since one ADC is provided in four rows, the number of ADCs is reduced by 75% to reduce power consumption and area.

On the other hand, if the entire operation result value is rearranged widely using a voltage amplifier, the effect of being more densely quantized within the same ADC precision may be obtained. In other words, more quantization operation values may be quantized with a smaller ADC precision without deterioration in accuracy. In this case, if the quantization range of the SAR ADC is doubled, the interval of the ADC itself becomes the same before and after the amplification. Therefore, the quantization range of the SAR ADC may be set to be the same as before the amplification, and the quantization interval of the ADC may be adjusted by clipping the output values exceeding the range. The adjustment of the clipping range is possible through the adjustment of the reference voltage of the SAR ADC and the unit capacitance of the CDAC (capacitive DAC). Therefore, it is possible to improve the TOPS/W and TOPS/mm2 with a smaller ADC precision while securing the accuracy by setting the quantization range of the SAR ADC to be the same as before the amplification while widely rearranging the entire operation result value through voltage amplification.

Figure 12:
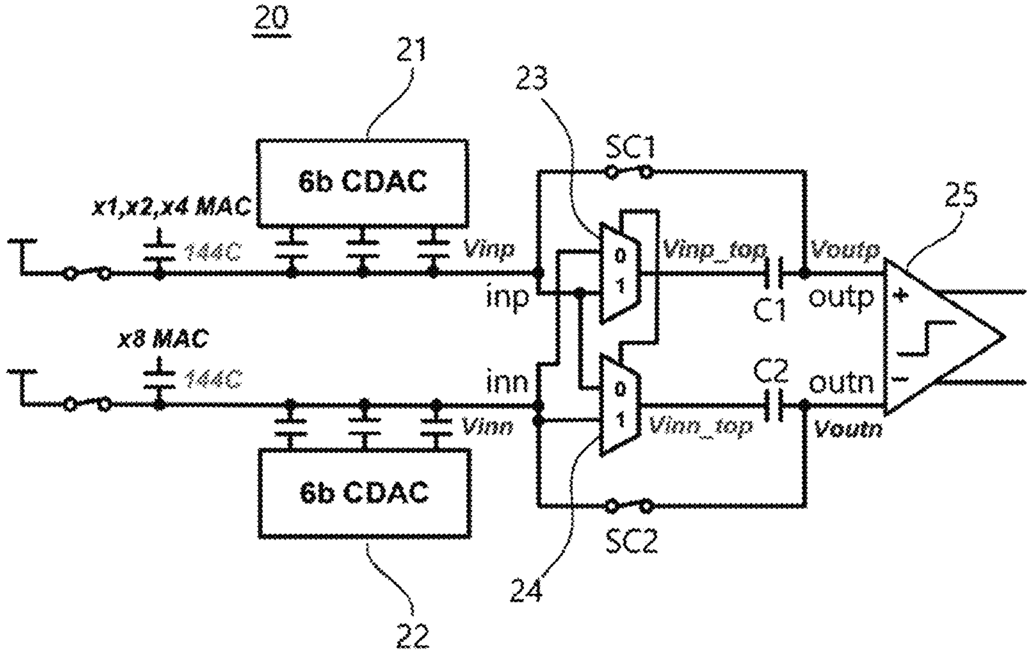
FIG. 12 shows a passive voltage amplifier circuit for a differential SAR ADC of a CIM device according to an embodiment of the present disclosure.

FIG. 12 shows a passive voltage amplifier circuit for a differential SAR ADC of a CIM device according to an embodiment of the present disclosure.

Referring to FIG. 12, the differential SAR ADC 20 includes a CDAC 21 and 22 and a comparator 25, and a passive voltage amplifier circuit provided between the CDAC 21 and 22 and the comparator 25. Since the operations of the CDAC 21 and 22 and the comparator 25 are the same as the operations of the general differential SAR ADC 20, detailed descriptions will be omitted.

The differential SAR ADC receives a differential input voltage composed of a first voltage Vinp and a second voltage Vinn. The first voltage Vinp is a voltage corresponding to the MAC operation result of the remaining bits (x1, x2, and x3) except for the most significant bit, and the second voltage Vinn is a voltage corresponding to the MAC operation result of the most significant bit (x8).

The passive voltage amplifier circuit receives the first voltage Vinp and the second voltage Vinn and outputs a differential voltage amplified by the difference between the first voltage Vinp and the second voltage Vinn to the (+) and (–) inputs of the comparator 25.

The passive voltage amplifier circuit according to an embodiment includes a first input terminal inp where the first voltage Vinp is input, a second input terminal inn where the second voltage Vinn is input, a first output terminal outp and a second output terminal outn that outputs the differential voltage amplified by a difference between the first voltage Vinp and the second voltage Vinn, a first 2:1 MUX 23, a second 2:1 MUX 24, a first capacitor C1 connected between an output of the first 2:1 MUX 23 and the first output terminal outp, a second capacitor C2 connected between an output of the second 2:1 MUX 24 and the second output terminal outn, a first switch SC1 connected between the first input terminal inp and the first output terminal outp, and a second switch SC2 connected between the second input terminal inn and the second output terminal outn. The first input terminal inp is connected to a "1" input of the first 2:1 MUX 23 and a "0" input of the second 2:1 MUX 24, and the second input terminal inn is connected to a "0" input of the first 2:1 MUX 23 and a "1" input of the second 2:1 MUX 24, The control input of the first 2:1 MUX 23 and the control input of the second 2:1 MUX 24 are connected to each other, so that the same control signal is applied. The first output outp is connected to the (+) input of the comparator 25, and the second output outn is connected to the (−) input of the comparator 25.

Figure 13:
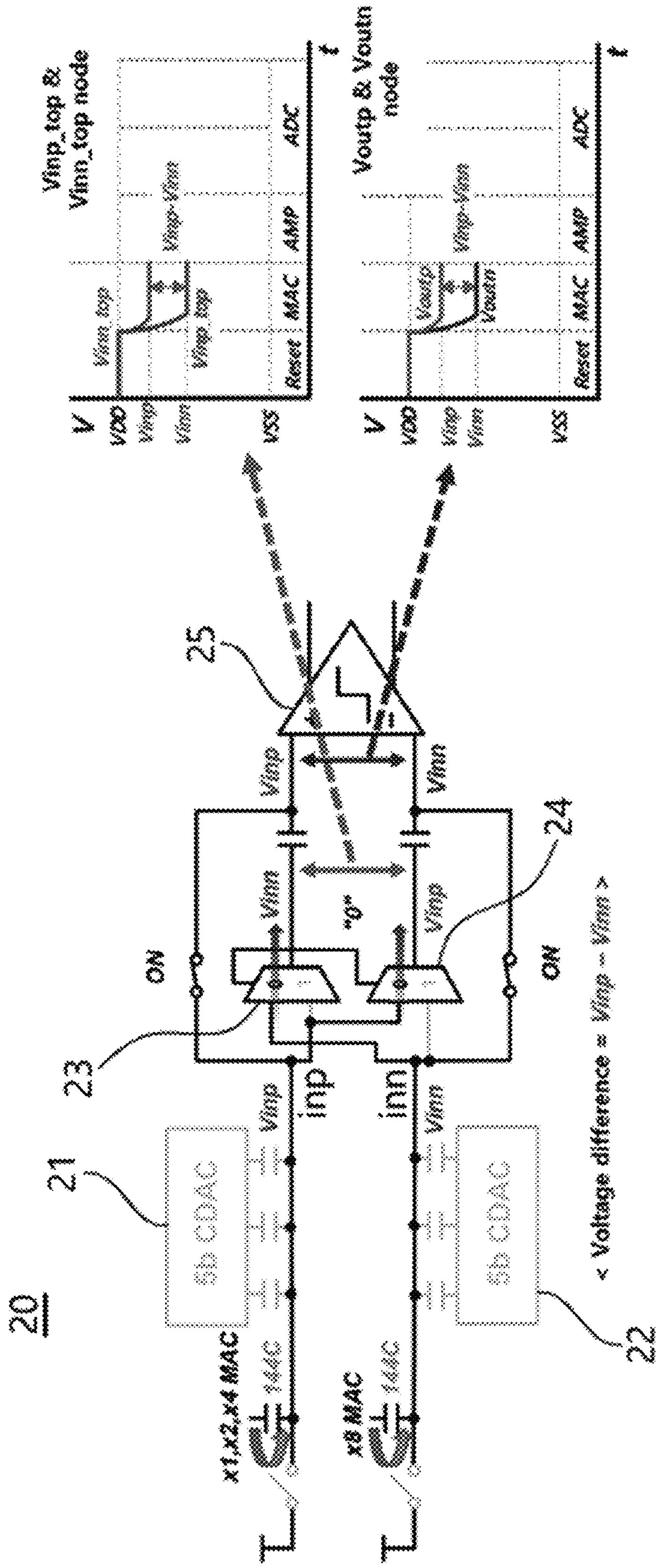
FIGS. 13 and 14 show an operation of the passive voltage amplifier circuit according to an embodiment of the present disclosure.
Figure 14:
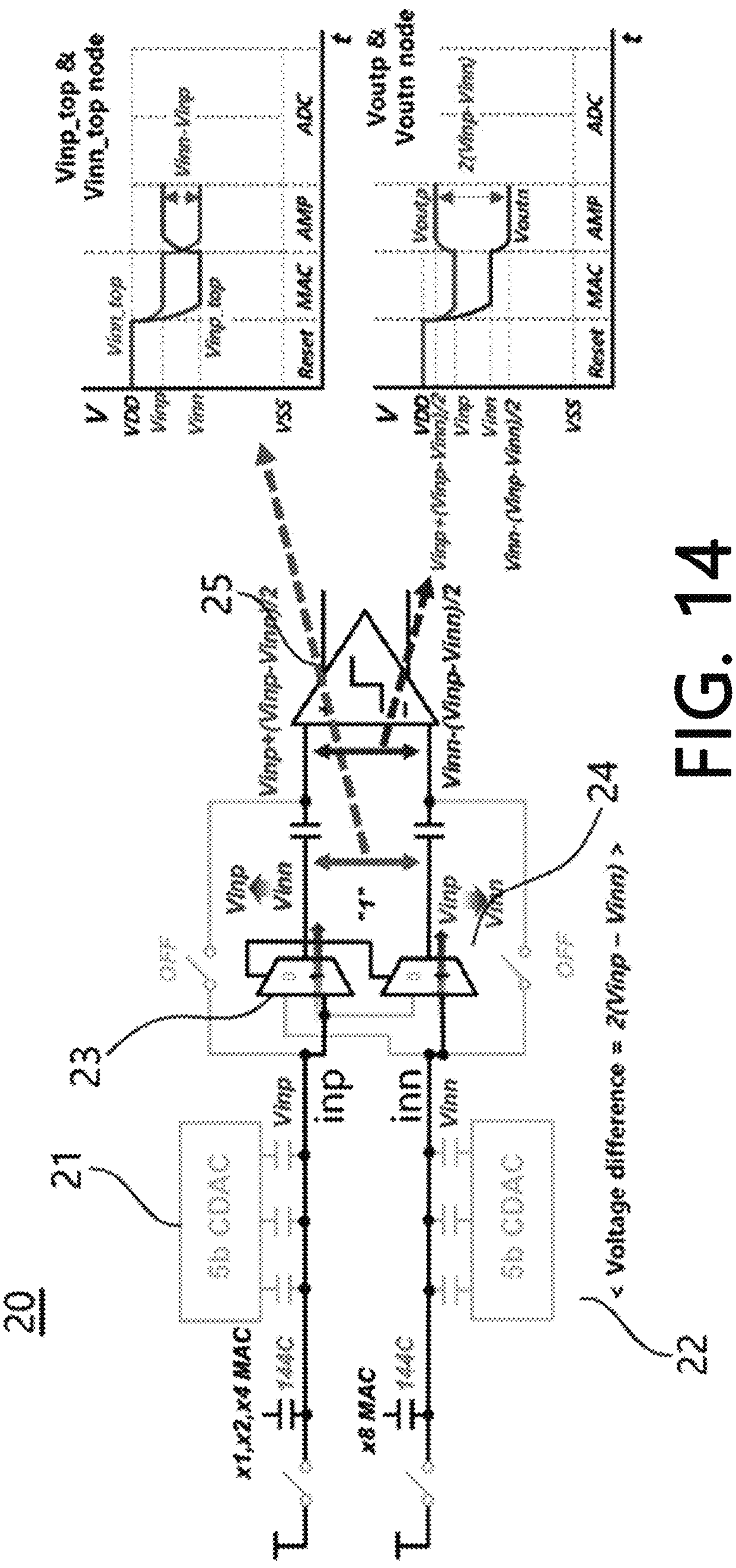

FIGS. 13 and 14 show an operation of the passive voltage amplifier circuit according to an embodiment of the present disclosure.

Referring to FIG. 13, a first switch SC1 and a second switch SC2 are connected, and the "0" is each applied to the control input of the first 2:1 MUX 23 and the control input of the second 2:1 MUX 24. Then, the second voltage Vinn is output as the output of the first 2:1 MUX 23, the first voltage Vinp is output as the output of the second 2:1 MUX 24, the first voltage Vinp is output as the first output terminal outp, and the second voltage Vinn is output as the second output terminal outn.

Next, referring to FIG. 14, the first switch SC1 and the second switch SC2 are blocked, and the "1" is each applied to the control input of the first 2:1 MUX 23 and the control input of the second 2:1 MUX 24. Then, the first voltage Vinp is output as the output of the first 2:1 MUX 23, and the second voltage Vinn is output as the output of the second 2:1 MUX 24. Through this, the voltage at the left terminal of the first capacitor C1 increases from the second voltage Vinn to the first voltage Vinp, and the voltage at the left terminal of the second capacitor C2 decreases from the first voltage Vinp to the second voltage Vinn. Then, the voltage of the right terminal of the first capacitor C1 increases by (Vinp−Vinn)/2 through the coupling of both terminals of the first capacitor C1, and the voltage of the right terminal of the second capacitor C2 is lowered by (Vinp−Vinn)/2 through the coupling of both terminals of the second capacitor C2. As a result, the voltage of the first output terminal outp becomes Vinp+(Vinp−Vinn)/2, and the voltage of the second output terminal outn becomes Vinn−(Vinp−Vinn)/2. Therefore, the differential voltage 2(Vinp−Vinn), which is the difference Vinp−Vinn between the first voltage Vinp and the second voltage Vinn amplified by two times, is output through the first output terminal outp and the second output terminal outn.

According to the embodiment of the present disclosure, it is possible to amplify the differential input voltage by two times without the additional voltage supply and damage to the conventional output voltage range. Therefore, it is possible to rearrange the entire operation result value widely, and it is possible to obtain an effect of being more densely quantized within the same ADC precision. According to embodiments of the present disclosure, bit positioning may be performed in an analog domain through a local switch. Therefore, there is no need for digital logic such as digital shift and adder, and thus area and energy efficiency may be improved. In addition, since the precision of the ADC may be reduced at the same accumulation number by using a passive voltage amplification circuit, it is possible to use an ADC with a smaller precision while securing the target accuracy. As described above, according to embodiments of the present disclosure, it is possible to implement a low-area and a low-power CIM structure through a smaller number of ADCs and a smaller ADC precision compared to the conventional CIM structure.

The above description is only illustrative of the technical idea of the present disclosure, and any person skilled in the art to which the present disclosure pertains will be able to make various modifications and variations without departing from the essential characteristics of the present disclosure. Therefore, the embodiments disclosed herein are for the purpose of describing the technical idea of the present disclosure rather than limiting the technical idea, and the scope of the technical idea of the present disclosure is not limited by these embodiments. The scope of the present disclosure should be interpreted by the following claims, and all technical ideas within the equivalent range should be interpreted as being included in the scope of the present disclosure.

The invention claimed is:

1. A Compute-In-Memory (CIM) device comprising:

first to fourth global bit line (GBLs) each configured to be divided into two sub-global bit lines having same capacitance;

first to fourth switches each configured to be connected between the two sub-global bit lines of each of the first to fourth global bit lines; and a switching circuit configured to generate a differential input voltage for a differential Successive Approximation Register (SAR) Analog-to-Digital Converter (ADC) by reflecting a corresponding bit position from an output voltage of each of the first to fourth global bit lines, the differential SAR ADC being configured to receive the differential input voltage to generate a digital signal, wherein the differential input voltage is composed of a first voltage and a second voltage, and the differential SAR ADC includes a passive voltage amplifier circuit configured to output the differential voltage amplified by a difference between the first voltage and the second voltage to a comparator, wherein the passive voltage amplifier circuit includes:

a first input terminal where the first voltage is input;

a second input terminal wherein the second voltage is input;

a first output terminal;

a second output terminal;

a first 2:1 MUX;

a second 2:1 MUX;

a first capacitor configured to be connected between an output of the first 2:1 MUX and the first output terminal;

a second capacitor configured to be connected between an output of the second 2:1 MUX and the second output terminal;

a first switch configured to be connected between the first input terminal and the first output terminal; and a second switch configured to be connected between the second input terminal and the second output terminal, wherein the first input terminal is connected to a "1" input of the first 2:1 MUX and a "0" input of the second 2:1 MUX, and the second input terminal is connected to a "0" input of the first 2:1 MUX and a "1" input of the second 2:1 MUX.

2. The CIM device of claim 1, wherein the first to third global bit lines are GBLs corresponding to remaining bits except for a most significant bit, and the fourth global bit line is a GBL corresponding to the most significant bit.

3. The CIM device of claim 2, wherein the switching circuit is configured to;

generate the first voltage of the differential input voltage by reflecting the bit position from the output voltage of each of the first to third global bit lines, and generate the second voltage of the differential input voltage by reflecting the bit position from the output voltage of the fourth global bit line.

4. The CIM device of claim 3, wherein the switching circuit includes:

a fifth switch configured to have one end connected to the first global bit line;

a sixth switch configured to have one end connected to the second global bit line;

a seventh switch configured to have one end connected to the third global bit line;

an eighth switch configured to have one end connected to the fourth global bit line;

a ninth switch configured to be connected between the other end of the fifth switch and the other end of the sixth switch;

a tenth switch configured to be connected between the other end of the sixth switch and the other end of the seventh switch;

an eleventh switch configured to be connected between the other end of the sixth switch and a VDD; and a twelfth switch configured to be connected between the other end of the eighth switch and a VDD.

5. The CIM device of claim 4, wherein the first to fourth switches are connected, the fifth to eighth switches are blocked, and the ninth to twelfth switches are blocked in operations of a Digital-to-Analog Convert (DAC) and a Multiply-Accumulate (MAC), the third switch is blocked, and the seventh switch is connected in order to reflect the bit position, then the third switch is connected, and the seventh switch is blocked, then the second switch is blocked, the third switch is blocked, the fifth to eighth switches are connected, and the eleventh and twelfth switches are blocked.

6. The CIM device of claim 1, wherein the control input of the first 2:1 MUX and the control input of the second 2:1 MUX are configured so that the same control signal is applied.

7. The CIM device of claim 6, wherein the first voltage is a voltage corresponding to a MAC operation result of remaining bits except for a most significant bit, and the second voltage is a voltage corresponding to a MAC operation result of the most significant bit.

8. The CIM device of claim 6, wherein the first output terminal is connected to a (+) input of a comparator, and the second output terminal is connected to a (−) input of the comparator.

9. The CIM device of claim 8, wherein the first switch and the second switch are connected and the "0" is each applied to the control input of the first 2:1 MUX and the control input of the second 2:1 MUX, such that the second voltage is output as the output of the first 2:1 MUX, the first voltage is output as the output of the second 2:1 MUX, the first voltage is output as the first output terminal, and the second voltage is output as the second output terminal, and then the first switch and the second switch are blocked, and the "1" is each applied to the control input of the first 2:1 MUX and the control input of the second 2:1 MUX, such that the first voltage is output as the output of the first 2:1 MUX, and the second voltage is output as the output of the second 2:1 MUX, and the differential voltage amplified by a difference between the first voltage and the second voltage is output through the first output terminal and the second output terminal by coupling each of the first capacitor and the second capacitor.

10. A passive voltage amplifier circuit for a differential Successive Approximation Register (SAR) Analog-to-Digital Converter (ADC) of a Compute-In-Memory (CIM) device, the passive voltage amplifier circuit comprising:

a first input terminal where a first voltage of a differential input voltage is input;

a second input terminal where a second voltage of the differential input voltage is input;

a first output terminal;

a second output terminal;

a first 2:1 MUX;

a second 2:1 MUX;

a first capacitor configured to be connected between an output of the first 2:1 MUX and the first output terminal;

a second capacitor configured to be connected between an output of the second 2:1 MUX and the second output terminal;

a first switch configured to be connected between the first input terminal and the first output terminal; and a second switch configured to be connected between the second input terminal and the second output terminal, wherein the first input terminal is connected to a "1" input of the first 2:1 MUX and a "0" input of the second 2:1 MUX, and the second input terminal is connected to a "0" input of the first 2:1 MUX and a "1" input of the second 2:1 MUX.

11. The passive voltage amplifier circuit of claim 10, wherein the control input of the first 2:1 MUX and the control input of the second 2:1 MUX are configured so that the same control signal is applied.

12. The passive voltage amplifier circuit of claim 11, wherein the first voltage is a voltage corresponding to a MAC operation result of remaining bits except for a most significant bit, and the second voltage is a voltage corresponding to a MAC operation result of the most significant bit.

13. The passive voltage amplifier circuit of claim 11, wherein the first output terminal is connected to a (+) input of a comparator, and the second output terminal is connected to a (−) input of the comparator.

14. The passive voltage amplifier circuit of claim 13, wherein the first switch and the second switch are connected and the "0" is each applied to the control input of the first 2:1 MUX and the control input of the second 2:1 MUX, such that the second voltage is output as the output of the first 2:1 MUX, the first voltage is output as the output of the second 2:1 MUX, the first voltage is output as the first output terminal, and the second voltage is output as the second output terminal, and then the first switch and the second switch are blocked, and the "1" is each applied to the control input of the first 2:1 MUX and the control input of the second 2:1 MUX, such that the first voltage is output as the output of the first 2:1 MUX, and the second voltage is output as the output of the second 2:1 MUX, and the differential voltage amplified by a difference between the first voltage and the second voltage is output through the first output terminal and the second output terminal by coupling each of the first capacitor and the second capacitor.

* * * * *